United States Patent
Chao et al.

(10) Patent No.: US 7,259,334 B2
(45) Date of Patent: *Aug. 21, 2007

(54) MULTI-LAYER PRINTED CIRCUIT WITH LOW NOISE

(75) Inventors: Shih-Chieh Chao, Taipei (TW); Chih-Wen Huang, Taipei (TW); Chun-Lin Liao, Taipei (TW)

(73) Assignee: Tatung Co., Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/055,615

(22) Filed: Feb. 11, 2005

(65) Prior Publication Data

US 2006/0090929 A1 May 4, 2006

(30) Foreign Application Priority Data

Nov. 3, 2004  (TW) ............................... 93133512 A

(51) Int. Cl.
*H05K 1/03* (2006.01)
(52) U.S. Cl. ...................................... 174/255; 174/260
(58) Field of Classification Search ................ 174/255, 174/260, 261, 262; 361/792, 793, 794, 795, 361/816, 818; 333/243, 246, 1, 12, 247
See application file for complete search history.

(56) References Cited

U.S. PATENT DOCUMENTS

| | | | | |
|---|---|---|---|---|
| 4,942,400 A * | 7/1990 | Tarzaiski et al. | ............. | 341/155 |
| 5,068,596 A * | 11/1991 | Banura | ....................... | 323/351 |
| 5,561,584 A * | 10/1996 | Tang | ........................... | 361/220 |
| 5,587,920 A * | 12/1996 | Muyshondt et al. | .......... | 716/15 |
| 5,736,796 A * | 4/1998 | Price et al. | .................. | 307/151 |
| 5,926,377 A * | 7/1999 | Nakao et al. | ................ | 361/763 |
| 6,219,255 B1 * | 4/2001 | Teshome | ..................... | 361/794 |
| 6,349,038 B1 * | 2/2002 | Hailey | ......................... | 361/794 |
| 6,473,312 B1 * | 10/2002 | Hiratsuka et al. | ........... | 361/794 |
| 7,068,518 B2 * | 6/2006 | Ueno et al. | .................. | 361/760 |

* cited by examiner

*Primary Examiner*—Ishwar (I. B.) Patel
(74) *Attorney, Agent, or Firm*—Bacon & Thomas, PLLC

(57) ABSTRACT

A multi-layer printed circuit board having a low noise characteristic, the multi-layer printed circuit board includes at least one circuit layer; at least one isolation line for dividing the at least one circuit layer into at least two areas, the at least one isolation line forming an open pattern and the at least one isolation line extendedly forming a long neck line into the at least one area; and at least one capacitor placed at one side of the opening of the open pattern in any one of the areas.

5 Claims, 4 Drawing Sheets

MULTI-LAYER PRINTED CIRCUIT WITH LOW NOISE

BACKGROUND OF THE INVENTION

1. Field of the Invention

The present invention relates to a multi-layer printed circuit board and more particularly, to a multi-layer printed circuit having low noise characteristics.

2. Description of the Related Art

Please refer to FIG. 1. FIG. 1 is shown a prior art printed circuit board. A printed circuit board 10 is composed of three different layers; one is for power, one is for ground, and the other is for components. A component layer (top side or bottom side) is used for the layout of signal line (as a signal layer). Electronic elements are placed on the top layer or the bottom layer of the printed circuit board 10, and signal pins, power pins and ground pins are respectively connected to the other electronic components on the component layer, the power layer, and the ground layer. Additionally, the electronic components can be divided into two groups, analog electronic components and digital electronic components. The analog electronic components may include an audio chip, an amplifier, a power supply, etc.; the digital electronic components may include a digital signal processor (DSP), a microprocessor, a video driver, etc. To avoid noise generated by the digital electronic components from affecting the analog electronic components, an isolation area 11 is usually separated from the power and/or ground layer of the printed circuit board 10. A portion within the isolation area 11 is called an analog electronic component area A1, and the other portion outside of the isolation area 11 is called the digital electronic component area A2. No connection exists between the analog electronic component area A1 and the digital electronic component area A2. Hence, noise generated by the digital electronic components cannot pass through the power layer to affect the analog electronic components, and the interference from the printed circuit board 10 is reduced significantly. Similarly, the ground layer of the printed circuit board 10 can have the same design.

However, when the connections between digital and the analog electronic components are required, the signal lines have to cross over the isolation area 11; the reference plane of the signal lines is not continuous and it will affect signal quality. Furthermore, the electromagnetic interferences between signals will become stronger and the electromagnetic radiations are likely to exceed EMC standards' limits. In a prior art, a metal neck line is used to connect the two isolation areas to provide continuous voltage levels, but the noise isolation between the areas becomes even lower near the resonant frequencies of the two isolation areas.

In a prior art technology for improving isolation effects, a decoupling capacitor is connected between the power layer and the ground layer. However, every capacitor has a series inductance, which provides effective filtering at low frequency regions but not at high frequency regions.

Therefore, it is desirable to provide a multi-layer printed circuit with low noise to mitigate and/or obviate the aforementioned problems.

SUMMARY OF THE INVENTION

A main objective of the present invention is to provide a multi-layer printed circuit having low noise characteristics.

In order to achieve the above-mentioned objective, the multi-layer printed circuit with low noise characteristics includes at least one component layer, and an isolation line. The isolation line is used for dividing the at least one component layer into at least two areas. The at least one isolation line forms an open pattern and a long neck line into the at least one area. An internal opening of the long neck line is located at the at least one area to reduce the noise near the resonant frequencies of the structure. The isolation line divides the printed circuit board into an analog electronic components area and a digital electronic components area. Since the analog electronic components area has an opening, the isolation line can be extendedly placed at the opening to form the long neck line to electrically connect the analog electronic components area and the digital electronic components area. The long neck line creates an equivalent inductance effect and shifts the resonant frequencies to a lower frequency region, enabling the decoupling capacitor to fully filter the noise. Since the signal lines connecting the analog electronic components area and the digital electronic components area are above the neck, the signal's return current can be easily back through the neck, the electromagnetic radiation from the printed circuit board is reduced.

The open pattern can be an open circle, an open triangle, an open rectangle, an open pentagon, an open hexagon or any other open pattern.

Furthermore, capacitors can be placed at the opening near the analog electronic components area or the digital electronic components area to improve the noise isolation of particular frequencies.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
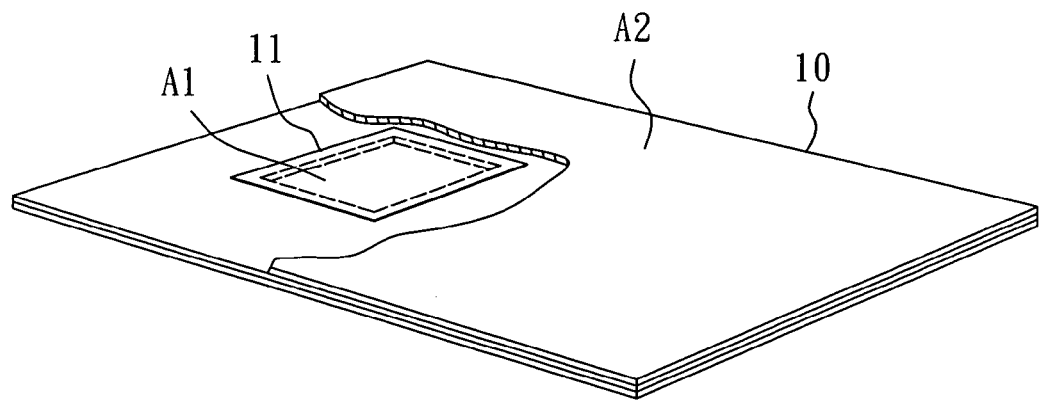
FIG. 1 is a schematic drawing of a prior art printed circuit board.
Figure 2:
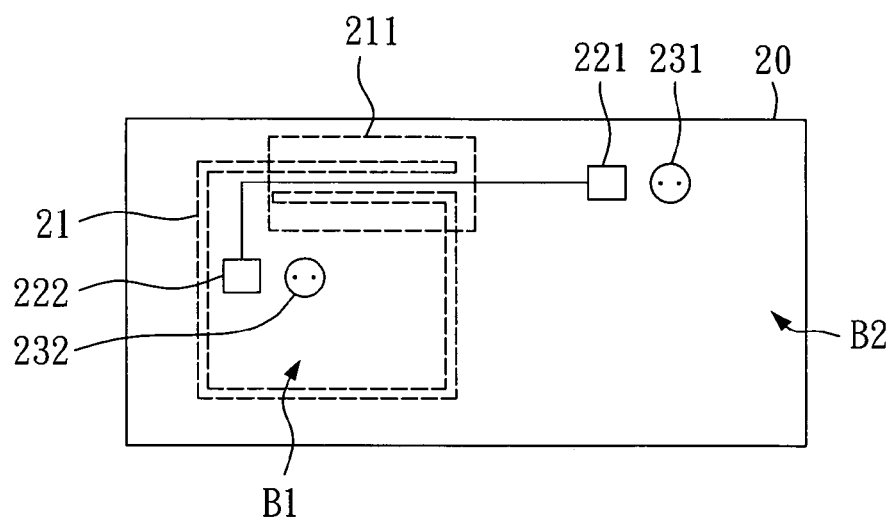
FIG. 2 is a schematic drawing of a printed circuit board of a first embodiment according to the present invention.

FIG. 2 is shown a schematic drawing of a printed circuit board of a first embodiment according to the present invention. A printed circuit 20 has a component layer, with a power layer and a ground layer (not shown) that are respectively placed above and below it. Many digital electronic components 221 and many analog electronic components 222 are placed on the printed circuit board 20. In this embodiment, an isolation line 21 is used to surround an analog electronic component area B1 to form an open rectangle and to extend into the analog electronic components area B1 to form a long neck line 211. The rest of the area of the printed circuit board 20 is a digital electronic components area B2. Signal lines for connecting the digital electronic components 221 and the analog electronic components 222 pass over the long neck line 211. This design can reduce noise interference between the two areas. Moreover, the electromagnetic radiation from the printed circuit board 20 can be reduced while maintaining the signal integrity.

The equivalent circuit of the long neck line 211 (about 32 mm) can be viewed as an inductor, and forms an LC resonator with the capacitive effect between the power and the ground layers. The resonant frequency happens when transmission coefficient reach its maximum value. Furthermore, a capacitor 232 and a capacitor 231 are added into the analog electronic component area B1 and the digital electronic component area B2 respectively to enhance noise filtering capabilities.

Figure 3:
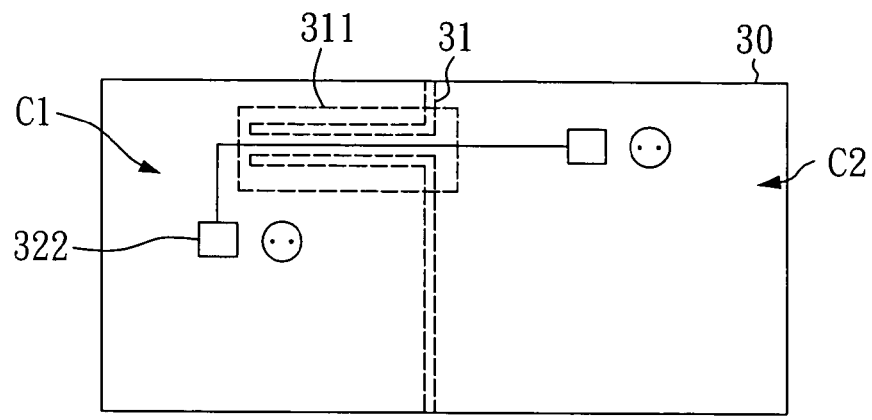
FIG. 3 is a schematic drawing of a printed circuit board of a second preferred embodiment according to the present invention.

FIG. 3 is shown the printed circuit board of a second preferred embodiment according to the present invention. The isolation line 31 divides the printed circuit board 30 into an analog electronic component area C1 and a digital electronic component area C2. However, compared to the first embodiment, the isolation line 31 does not surround all of the analog electronic components 322. In this embodiment, the isolation line 31 extends toward the analog electronic component area C1 to form a long neck line 311, which has the same effects to the previous embodiment.

Figure 4:
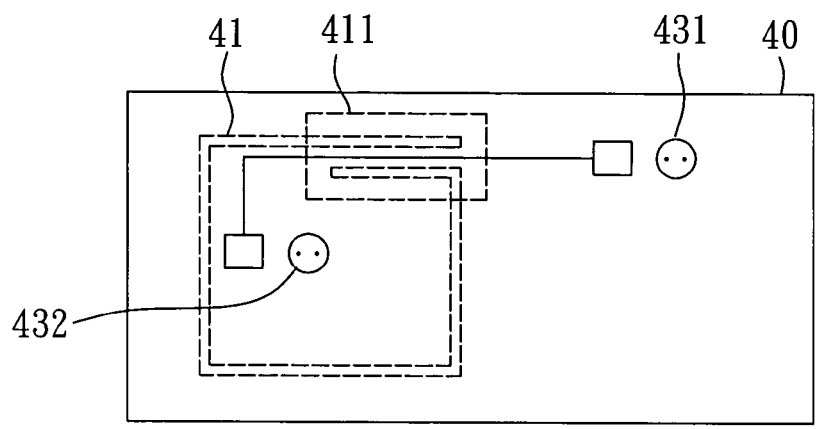
FIG. 4 is a schematic drawing of a printed circuit board of a third preferred embodiment according to the present invention.

FIG. 4 is shown the printed circuit board of a third preferred embodiment according to the present invention. However, compared to the first embodiment, a long neck line 411 formed by the isolation line 41 has a 16 mm length, which is half the length in the first embodiment, but which still has the same effects.

Figure 5:
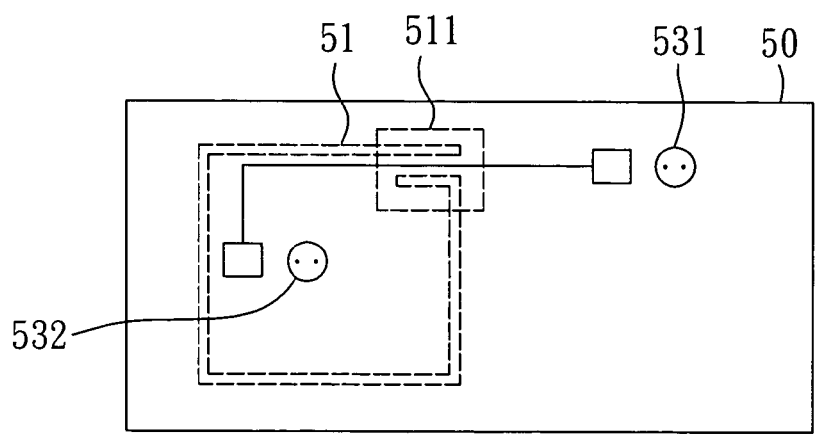
FIG. 5 is a schematic drawing of a printed circuit board of a fourth preferred embodiment according to the present invention.

FIG. 5 is shown the printed circuit board of a fourth preferred embodiment according to the present invention. However, compared to the first embodiment, a long neck line 511 formed by the isolation line 51 has a 2 mm length, but which still has the same effects.

Figure 7:
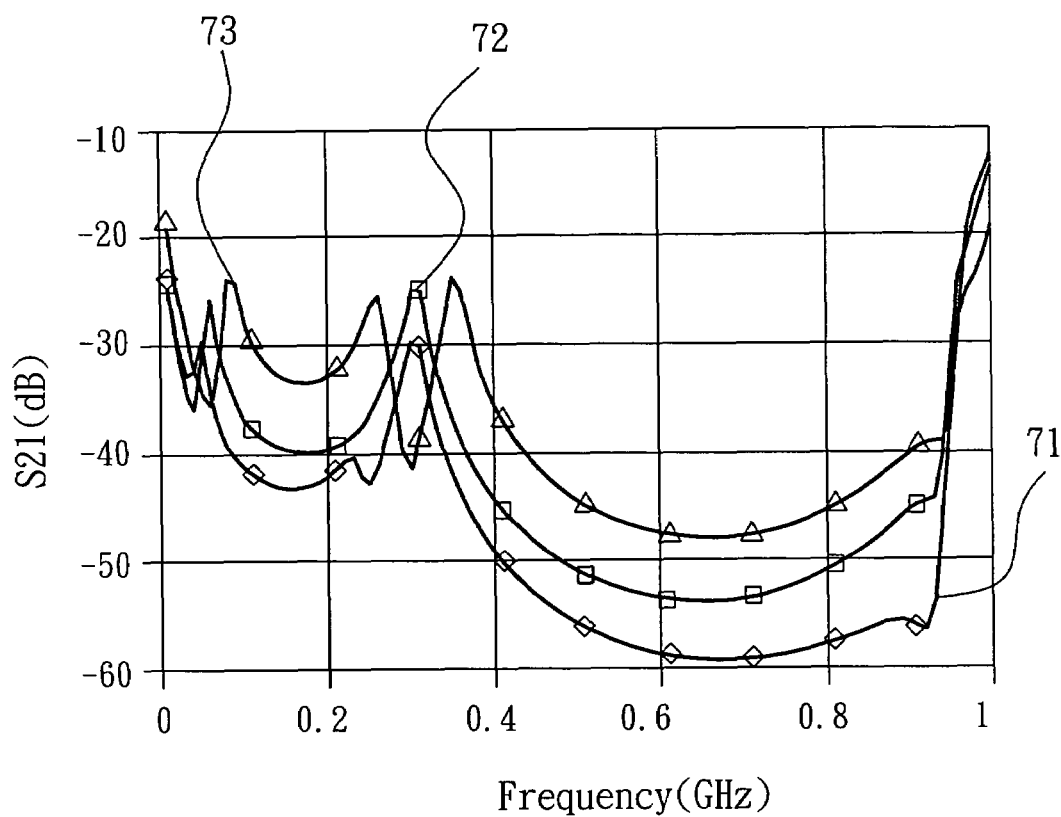
FIG. 7 is shown the transmission coefficient of electromagnetic scattering parameters for different long neck line lengths with capacitors.

FIG. 7 is shown the transmission coefficient of electromagnetic
scattering parameters for different long neck line lengths having a capacitor. In FIG. 7, curve 71 is of the first embodiment (with a long neck line length of 32 mm), curve 72 is of the third embodiment (with a long neck line length of 16 mm), and curve 73 is of the fourth embodiment (with a long neck line length of 2 mm) respectively. Accordingly, the long neck line with a length of 32 mm as depicted by the graph 71 has the best isolation effect.

Figure 6:
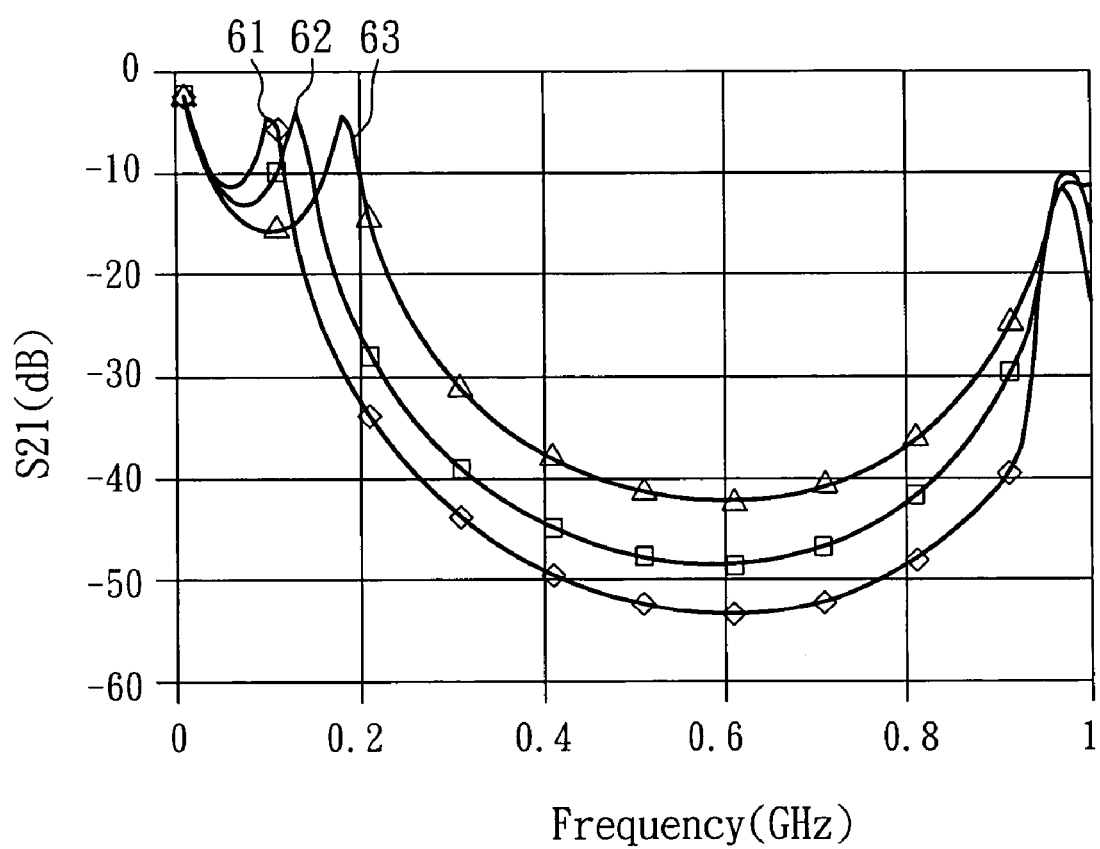
FIG. 6 is shown the transmission coefficient of electromagnetic scattering parameters for different long neck line lengths without capacitor.

Although the above-mentioned three embodiments do not include the capacitors 231, 232, 431, 432, 531, 532, they still have the noise reduction capabilities. Please refer to FIG. 6. FIG. 6 is shown the transmission coefficient of electromagnetic scattering parameters for different long neck line lengths without capacitor. Curve 61 is of the first embodiment (with a long neck line length of 32 mm, and without the capacitors 231, 232); curve 62 is of the third embodiment (with a long neck line length of 16 mm, and without the capacitors 431, 432); and curve 63 is of the fourth embodiment (with a long neck line length of 2 mm, and without the capacitors 531, 532). Compared to FIG. 7, the capacitors 231, 232, 431, 432, 531, 532 are important for reducing noise and changing the resonant frequencies.

Although the present invention has been explained in relation to its preferred embodiment, it is to be understood that many other possible modifications and variations can be made without departing from the spirit and scope of the invention as hereinafter claimed.

What is claimed is:

1. A multi-layer printed circuit board having a low noise characteristic, the multi-layer printed circuit board comprising:
   at least one circuit layer; and
   at least one isolation line for dividing the at least one circuit layer into at least two areas, the at least one isolation line forming an open pattern and the at least one isolation line having at least one end portion extending into one of the at least two areas forming a long neck line extending into the one of the at least two areas;
   wherein the long neck line directly connects the one of the at least two areas with another one of the at least two areas.

2. The multi-layer printed circuit board as claimed in claim 1, wherein the open pattern is an open rectangle.

3. The multi-layer printed circuit board as claimed in claim 1 further comprising at least one capacitor placed at one side of the opening of the open pattern in any one of the areas.

4. The multi-layer printed circuit board as claimed in claim 1 comprising at least one analog area and at least one digital area.

5. The multi-layer printed circuit board as claimed in claim 1, wherein the at least one circuit layer comprises three circuit layers, which include a power layer, a ground layer, and a component layer.

* * * * *